(12) United States Patent
Monk et al.

(10) Patent No.: US 10,673,463 B2
(45) Date of Patent: Jun. 2, 2020

(54) COMBINED BLOCKS OF PARTS OF ERASURE CODED DATA PORTIONS

(71) Applicant: Hewlett Packard Enterprise Development LP, Houston, TX (US)

(72) Inventors: Russell Ian Monk, Caldicot (GB); Mark Robert Watkins, Bristol (GB); Peter Thomas Camble, Bristol (GB)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/170,909

(22) Filed: Oct. 25, 2018

(65) Prior Publication Data
US 2020/0136656 A1 Apr. 30, 2020

(51) Int. Cl.
*H03M 13/00* (2006.01)
*H03M 13/29* (2006.01)
*H03M 13/15* (2006.01)
*G06F 11/10* (2006.01)

(52) U.S. Cl.
CPC ..... *H03M 13/2906* (2013.01); *G06F 11/1076* (2013.01); *H03M 13/154* (2013.01); *H03M 13/1515* (2013.01)

(58) Field of Classification Search
CPC ......... H03M 13/2906; H03M 13/1515; H03M 13/154; G06F 11/1076
See application file for complete search history.

(56) References Cited

U.S. PATENT DOCUMENTS

| 7,797,281 | B1 | 9/2010 | Greene et al. |
| 7,822,856 | B2 * | 10/2010 | Zuckerman ......... H04L 67/1008 709/226 |
| 8,458,287 | B2 * | 6/2013 | Ozzie ................. G06F 11/1004 709/217 |
| 8,819,260 | B2 * | 8/2014 | Zuckerman ......... H04L 67/1008 709/231 |
| 8,838,595 | B2 | 9/2014 | Kesselman |
| 9,270,414 | B2 * | 2/2016 | Shokrollahi .......... H04L 1/0041 |
| 9,501,368 | B2 | 11/2016 | Beatty et al. |
| 9,805,046 | B2 | 10/2017 | Amit et al. |
| 9,830,221 | B2 * | 11/2017 | Slik .................. H03M 13/3761 |
| 10,079,612 | B1 * | 9/2018 | Li ......................... H03M 13/13 |

(Continued)

OTHER PUBLICATIONS

IBM Corp., "About Object Storage," Feb. 23, 2017, https://console.bluemix.net/docs/services/ObjectStorage/os_works_public.html#about-object-storage.

(Continued)

*Primary Examiner* — Esaw T Abraham
(74) *Attorney, Agent, or Firm* — Hewlett Packard Enterprise Patent Department

(57) ABSTRACT

Examples are disclosed including generation of a first erasure coded data portion based on a first data portion of the data object, generation of a second erasure coded data portion based on a second data portion of the data object, formation of a first combined block by combining a first part of the first erasure coded data portion and a first part of the second erasure coded data portion, formation of a second combined block by combining a second part of the first erasure coded data portion and a second part of the second erasure coded data portion, storage of the first combined block in a first storage location, and storage of the second combined block in a second storage location.

20 Claims, 8 Drawing Sheets

(56) References Cited

U.S. PATENT DOCUMENTS 10,218,789 B2 * 2/2019 Yang .................. G06F 11/1068
10,447,317 B2 * 10/2019 Chang ..................... H04B 1/48

OTHER PUBLICATIONS

Microsoft, "Data Partitioning," Jul. 13, 2016, https://docs.microsoft.com/en-us/azure/architecture/best-practices/data-partitioning.
Oracle, "Partitioning Concepts," 2018, https://docs.oracle.com/cd/B28359_01/server.111/b32024/partition.htm.

* cited by examiner

COMBINED BLOCKS OF PARTS OF ERASURE CODED DATA PORTIONS

BACKGROUND

Data may be stored at a first location, and may also be stored at another location for backup purposes in case for example the first storage fails or the data stored therein becomes corrupted.

A data object may be 'erasure coded' using an erasure code technique, including, for example, encoding the data of the data object with additional data useable to recover a certain amount of the data of the data object (e.g., if that amount of the data object is lost).

BRIEF DESCRIPTION OF DRAWINGS

Non-limiting examples will now be described, with reference to the accompanying drawings, in which.

DETAILED DESCRIPTION

Figure 1:
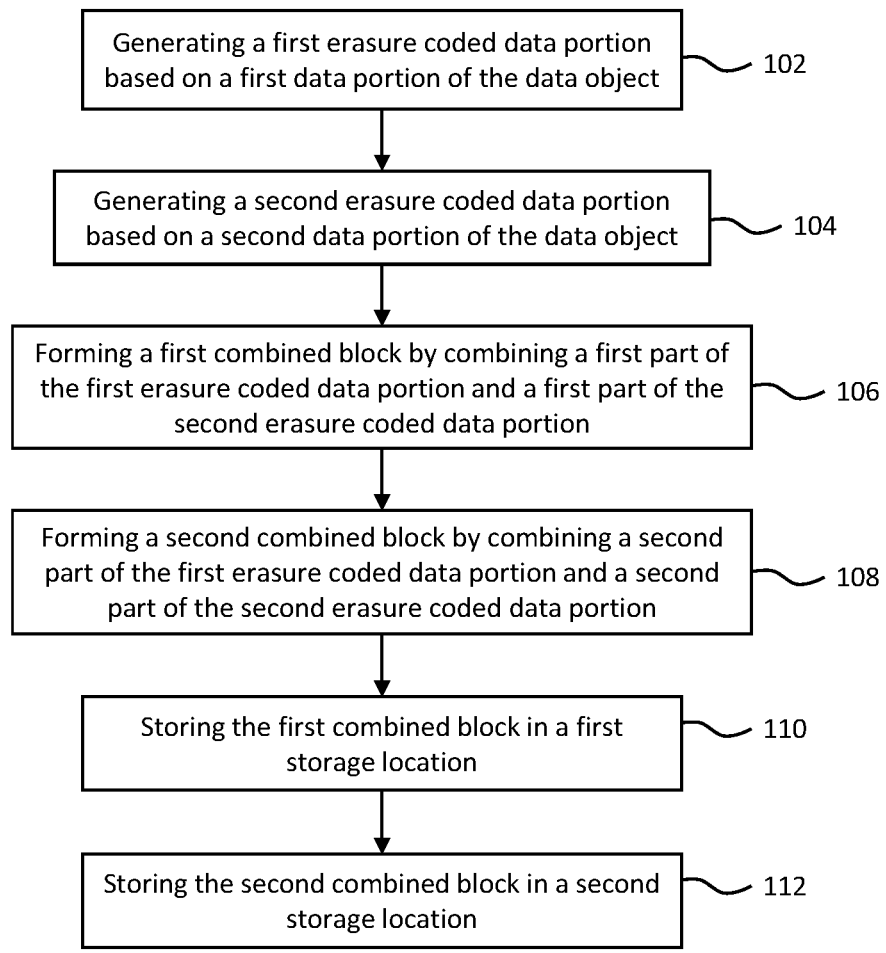
FIG. 1 is a flowchart of an example of a method of storing a data object.

The following discussion is directed to various examples of the disclosure. The examples disclosed herein should not be interpreted, or otherwise used, as limiting the scope of the disclosure, including the claims. In addition, the following description has broad application, and the discussion of any example is meant only to be descriptive of that example, and not intended to intimate that the scope of the disclosure, including the claims, is limited to that example. Throughout the present disclosure, the terms "a" and "an" are intended to denote at least one of a particular element. In addition, as used herein, the term "includes" means includes but not limited to. The term "based on" means based at least in part on.

In some examples of data storage, a large data object may be compressed, encrypted and stored, in some examples in parts which are distributed between different storage locations. The storage locations may be physically separated, or may for example comprise logically defined storage modules or partitions in a localised storage volume. If at a later time one or more portions of a large data object, which may be relatively small portions of that data object, are to be retrieved, the whole object may be retrieved and reconstructed from the encrypted and compressed data to extract the parts that are desired. Therefore, retrieval of the desired portions of the object may be inefficient, for example in terms of input/output (IO), memory, processing, network bandwidth and number of operations, when the whole object is retrieved to obtain the desired portions. In other examples of data storage, a large object can be stored as many small data objects, each small object being compressed, encrypted and stored as parts in distributed storage locations. Thus, one small object can be retrieved from the associated parts and reconstructed instead of the whole large object. However, storing a large object as many small objects can increase the number of storage operations to store the large object, the amount of metadata associated with the large object, and the storage space used.

Examples disclosed herein may separate a data object, such as for example a collection or stream of data, into data portions. In an example, each data portion may be erasure coded to form a respective erasure coded data portion, and may in some examples also be compressed (e.g. the compressed portion may be erasure coded prior to or following compression) and/or encrypted. Each erasure coded data portion may be separated into parts and each part of a particular erasure coded data portion may be combined with respective part(s) of one or more other erasure coded data portion(s) to form respective combined blocks that may each be stored in a different storage location. In such examples, parts that are generated based on a single data portion of the data object may be stored in different storage locations. In some examples, each storage location may store respective parts of multiple erasure coded data portions (for example as a single combined block or file), each part derived from a different data portion of the data object. In some examples, a part of an erasure coded data portion can be retrieved from a combined block or file without retrieving the whole combined block or file from its storage location. For example, this may be accomplished using metadata which is created as part of the data storage operation.

As a result, in some examples, multiple parts, from different erasure coded data portions, can be stored in an efficient manner in a single location, for example as one combined block stored in a single storage operation and/or as a single file. In some examples, retrieval of a data portion of the data object can also be carried out in an efficient manner, as the respective parts of a particular erasure coded data portion can be retrieved from respective storage locations without retrieving the entirety of each combined block containing the parts, and the data portion of the data object can be derived (e.g., reconstructed) from the erasure coded data portion.

FIG. 1 is a flow chart of an example of a method 100, which may be a computer implemented method carried out by at least one processor of a computing device executing instructions stored on a machine-readable storage medium. A data object may for example be generated or received by a device such as a computing device or data processing device which carries out the method. In some examples, the data object may be stored locally to the device, such as for example in non-volatile storage (e.g., a solid state drive (SSD), a hard disk drive (HDD), etc.).

The method 100 comprises, in block 102, generating a first erasure coded data portion based on a first data portion of the data object. The erasure coded data portion may be generated using any suitable erasure coding process, such as for example Reed Solomon coding. Block 104 of the method 100 comprises generating a second erasure coded data portion based on a second data portion of the data object. In some examples, the first and second data portions are different portions of the data object, though in some examples the data portions of the data object may overlap (e.g. some data from the data object may be included in multiple of the data portions). While the method 100 is described in terms of first and second data portions, the method 100 could comprise generating any number of data portions from the data object, and in practical examples, the number of data portions generated may be greater than two.

The method 100 also comprises, in block 106, forming a first combined block by combining a first part of the first erasure coded data portion and a first part of the second erasure coded data portion. The combined block may be, for example, a single data object or file, and may be formed by, for example, concatenating the first parts, or by any other suitable method of combining them. The method 100 also comprises, in block 108, forming a second combined block by combining a second part of the first erasure coded data portion and a second part of the second erasure coded data portion.

The method also comprises, in block 110, storing the first combined block in a first storage location, and in block 112, storing the second combined block in a second storage location. In some examples, the first and/or second storage locations may be remote from one another, remote from the device carrying out the method 100, or remote from a source of the data object, or a combination thereof. In some examples, the first and second data storage locations may be remote from each other, such that a failure of or loss of data at one of the first and second storage locations may not affect the availability of the data at the other storage location. In some examples, the first and second parts of the first erasure coded data portion may be different parts of the first erasure coded data portion, though in other examples some data in the first erasure coded data portion may be common to both parts.

In some examples, storage of a combined block in a storage location (e.g. storage of the first combined block in the first storage location) is performed in a single storage operation, such as for example storing a single file in the storage location.

Therefore, in some examples, data from a first data portion of the data object is erasure coded and split into parts that are stored in different storage locations in different combined blocks. Similarly, for example, data from a second data portion of the data object is erasure coded and split into parts that are stored in different storage locations in different combined blocks. As a result, in some examples, loss of one part of an erasure coded data portion (e.g. failure or unavailability of the first or second storage location) may still allow the erasure coded data portion to be reconstructed due to the erasure coding.

Additionally or alternatively, in some examples, if a part of the data object is to be accessed or retrieved, then those parts of the relevant erasure coded data portion (i.e., containing the data to be accessed or retrieved) from the appropriate combined blocks can be accessed without accessing or retrieving data of other erasure coded data portions and without accessing or retrieving the entirety of the combined blocks containing the parts of the relevant erasure coded data portion. In such examples, metadata indicating where parts are stored may be determined as part of the data storage method and used to identify individual parts for retrieval. For example, if the first data portion of the data object is to be accessed, then the first part of the first erasure coded data portion can be accessed at the first storage location from within the first combined block, and the second part of the first erasure coded data portion can be accessed at the second storage location from within the second combined block, and so on for each part of the first erasure coded data portion. The first data portion of the data object can then be reconstructed from these parts, without accessing or retrieving the parts of the second erasure coded data portion associated with the second data portion of the data object, and without accessing or retrieving other parts within the combined blocks. Therefore, retrieval of a data portion of the data object can in some examples be performed in an efficient manner.

As mentioned above, in some examples, the data object may be partitioned into one or more further data portions, each further data portion leading to a further erasure coded data portion that can be split into parts and stored in respective combined blocks at respective storage locations (including the first and second combined blocks and the first and second storage locations). Additionally or alternatively, in some examples, each erasure coded data portion can be separated into three or more parts, each part of a particular erasure coded data portion being stored in a different combined block at a respective (different) storage location (e.g. first storage location, second storage location, third storage location, and so on). Each storage location may in some examples be different from and/or remote from each other storage location.

Figure 2:
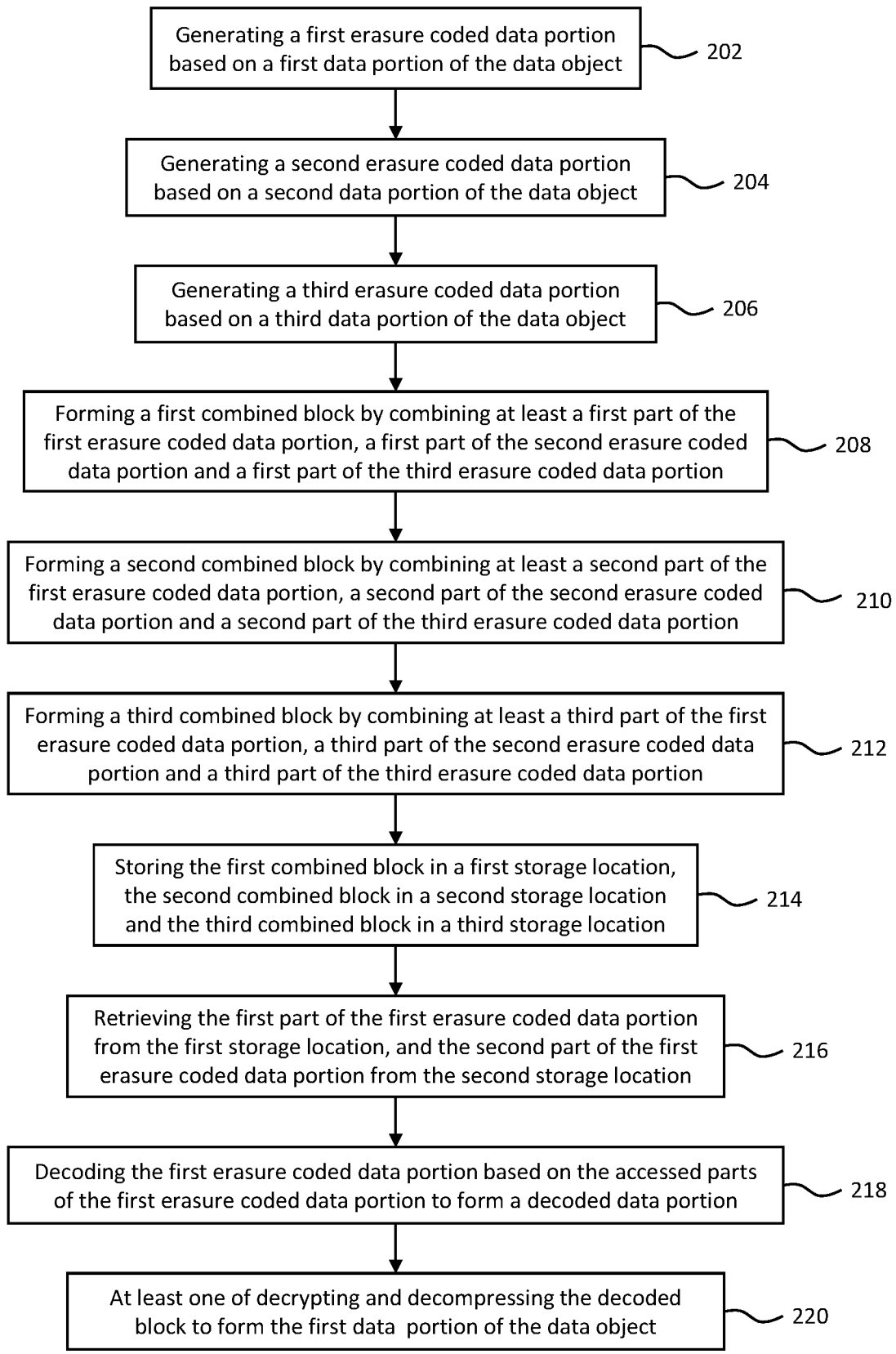
FIG. 2 is a flowchart of an example of a method of storing a data object.

FIG. 2 is a flow chart of an example of a method 200 of storing a data object. The method may for example comprise a computer implemented method and may be executed by at least one processor of a computing device executing instructions stored on a machine-readable storage medium. The method 200 comprises, in block 202, generating a first erasure coded data portion based on a first data portion of the data object, and in block 204, generating a second erasure coded data portion based on a second data portion of the data object. The method 200 also comprises, in block 206, generating a third erasure coded data portion based on a third data portion of the data object. In some examples, the first, second and third data portions comprise different portions of the entire data object, though in some examples the data portions of the data object may overlap (e.g. some data from the data object may be included in two data portions). In this example, generating an erasure coded data portion based on a data portion of the data object in block 202, 204 and/or 206 of the method 200 comprises compressing and encrypting the data portion of the data object. However, in other examples, either one of compression or encryption may be used without the other in generating the erasure coded data portion (or indeed the erasure coded data portion may be generated using neither of compression or encryption).

The method 200 also comprises, in block 208, forming a first combined block by combining at least a first part of the first erasure coded data portion, a first part of the second erasure coded data portion and a first part of the third erasure coded data portion, and in block 210, forming a second combined block by combining at least a second part of the first erasure coded data portion, a second part of the second erasure coded data portion, and a second part of the third erasure coded data portion. The method 200 also comprises, in block 212, forming a third combined block by combining at least a third part of the first erasure coded data portion, a third part of the second erasure coded data portion, and a third part of the third erasure coded data portion. In other examples, there may be one or more further data portions of the data object, wherein respective erasure coded data portions are generated for each such data portion, and parts of each of the erasure coded data portions may be being stored in the combined blocks in respective storage locations.

Block 214 of the method 200 comprises storing the first combined block in a first storage location, the second combined block in a second storage location, and the third combined block in a third storage location. In some examples, each of these storage operations may be performed in a single storage operation, respectively. Additionally or alternatively, in some examples, these storage operations may comprise storing each combined block as a single file, respectively.

Block 216 of the method 200 comprises retrieving the first part of the first erasure coded data portion from the first storage location, and the second part of the first erasure coded data portion from the second storage location. The method 200 may also comprise retrieving the third part of the first erasure coded data portion from the third storage location. In some examples, the retrieving can be carried out in response to a request to access the data object, such as for example a request to access the first data portion of the data object. In some examples, the parts of the first erasure coded data portion are retrieved from the first, second, and third combined blocks without retrieving the entirety of each of these combined blocks. For example, parts of other erasure coded data portion within the combined blocks are not retrieved. The parts to be retrieved may for example be identified using metadata or the like, which may be created as part of the data storage method.

In some examples, more than one erasure coded data portion may be retrieved from the first and second storage locations. For example, a first part of a first erasure coded data portion and a first part of a second erasure coded data portion may be retrieved from the first storage location. This may be done for example at the same time or in a single retrieval operation. Similarly, a second part of the first erasure coded data portion and a second part of the second erasure coded data portion may be retrieved from the second storage location. The associated portions of the data object may then be reproduced from the erasure coded data portion. In some examples, parts of other erasure coded data portions are not retrieved from the storage locations if their associated data portions of the data object are not requested, for example. In other examples, more parts of one or more erasure coded data portions may also be retrieved, for example at the same time or in the single retrieval operations.

In this example, generating an erasure coded data portion based on a data portion of the data object (e.g. in block 202, 204 and/or 206 of the method 200) comprises compressing and/or encrypting the data portion of the data object. Thus the method 200 comprises, in block 218, decoding (e.g. Reed Solomon decoding) the first erasure coded data portion based on the accessed parts of the first erasure coded data portion (e.g., the first part, the second part, etc.) to form a decoded data portion (which may be equivalent to an encrypted and compressed version of the data portion). In block 220, the decoded data portion may be at least one of decrypted or decompressed to form the first data portion of the data object. In some examples, the coding used to generate the erasure coded data portion may provide an erasure coded data portion including systematic bits, and hence the decoding may comprise for example separating the systematic bits from the data portion, and/or discarding the parity bits of the data portion.

In some examples, where there are any number of data portions of the data object and corresponding erasure coded data portions, and each erasure coded data portion is separated into any number of parts, loss of up to a certain number of parts of an erasure coded data portion (depending on the erasure code used) may still allow the erasure coded data portion (or the data it represents) to be reconstructed or retrieved. Thus, in this example, the third part of the first erasure coded data portion is not retrieved, for example.

Figure 3:
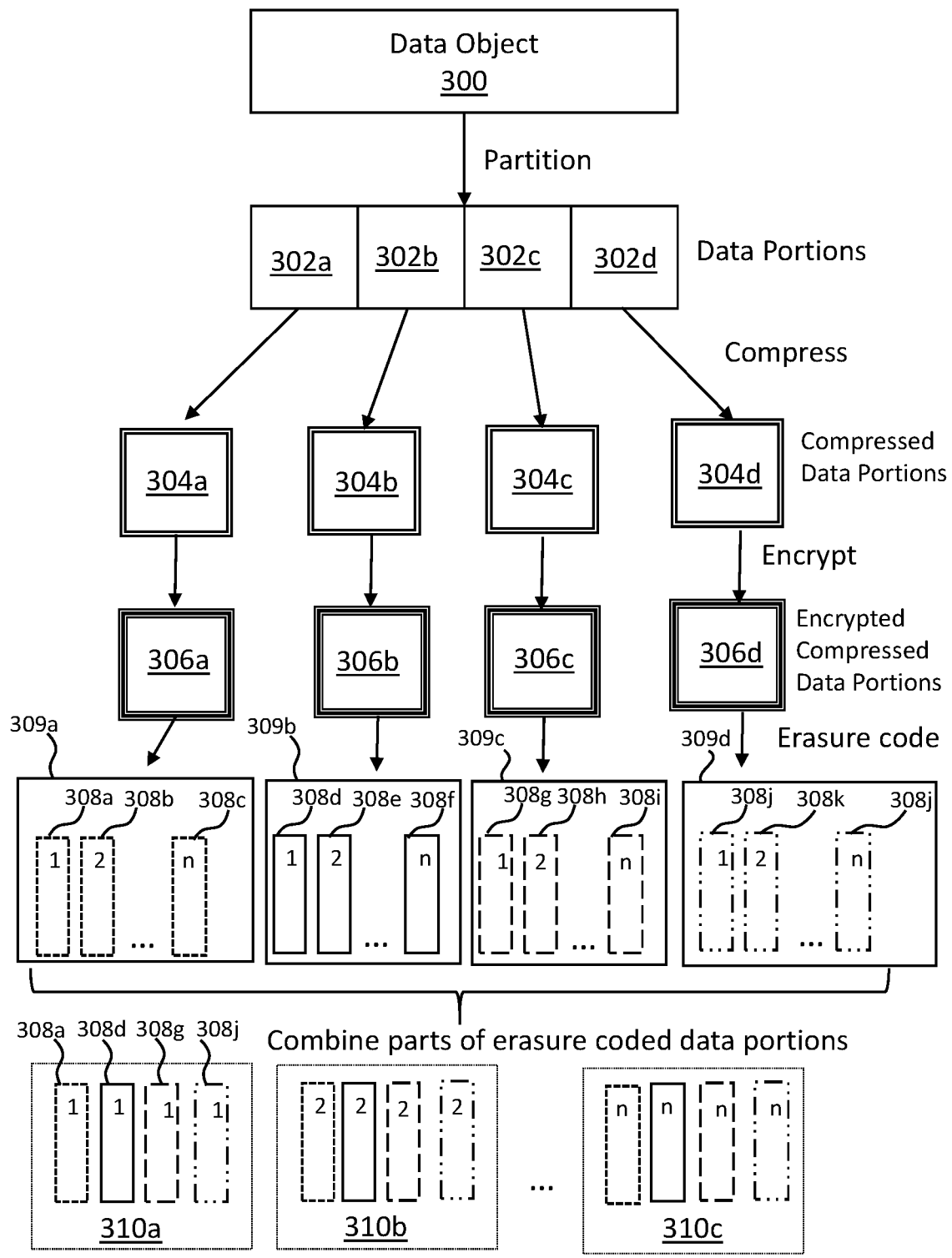
FIG. 3 is a schematic representation of an example method of storing a data object.

FIG. 3 shows a schematic representation of an example method in which a data object 300 is partitioned into four data portions 302a-d, although in other examples more or fewer data portions may be formed. Each of the data portions 302a-d is, in this example, compressed to form compressed data portions 304a-d, then encrypted to form encrypted compressed data portions 306a-d. Each of these encrypted compressed data portions 306a-d is then subjected to erasure coding to form erasure coded data portions 309a-d that are separated into a plurality of parts 308, including parts 308a-j. A broken line notation is used to indicate that, in some examples, there may be more parts 308 than are shown in this example. That is, each of the erasure coded portions 309 may be separated into any suitable number of parts 308. The parts 308a-j are then combined to form combined blocks 310a-c. In this example, each combined block 310 comprises a plurality of parts 308, each originating from a respective data portion 302 of data object 300, although this need not be the case in all examples. For example, in the example of FIG. 3, combined block 310a includes at least parts 308a, 308d, 308g, and 308j from erasure coded data portions 309a, 309b, 309c, and 309d, respectively. The combined blocks 310a-c may each then be stored in different locations (e.g., on physically separate computing devices that are physically remote from one another, etc.).

Figure 4:
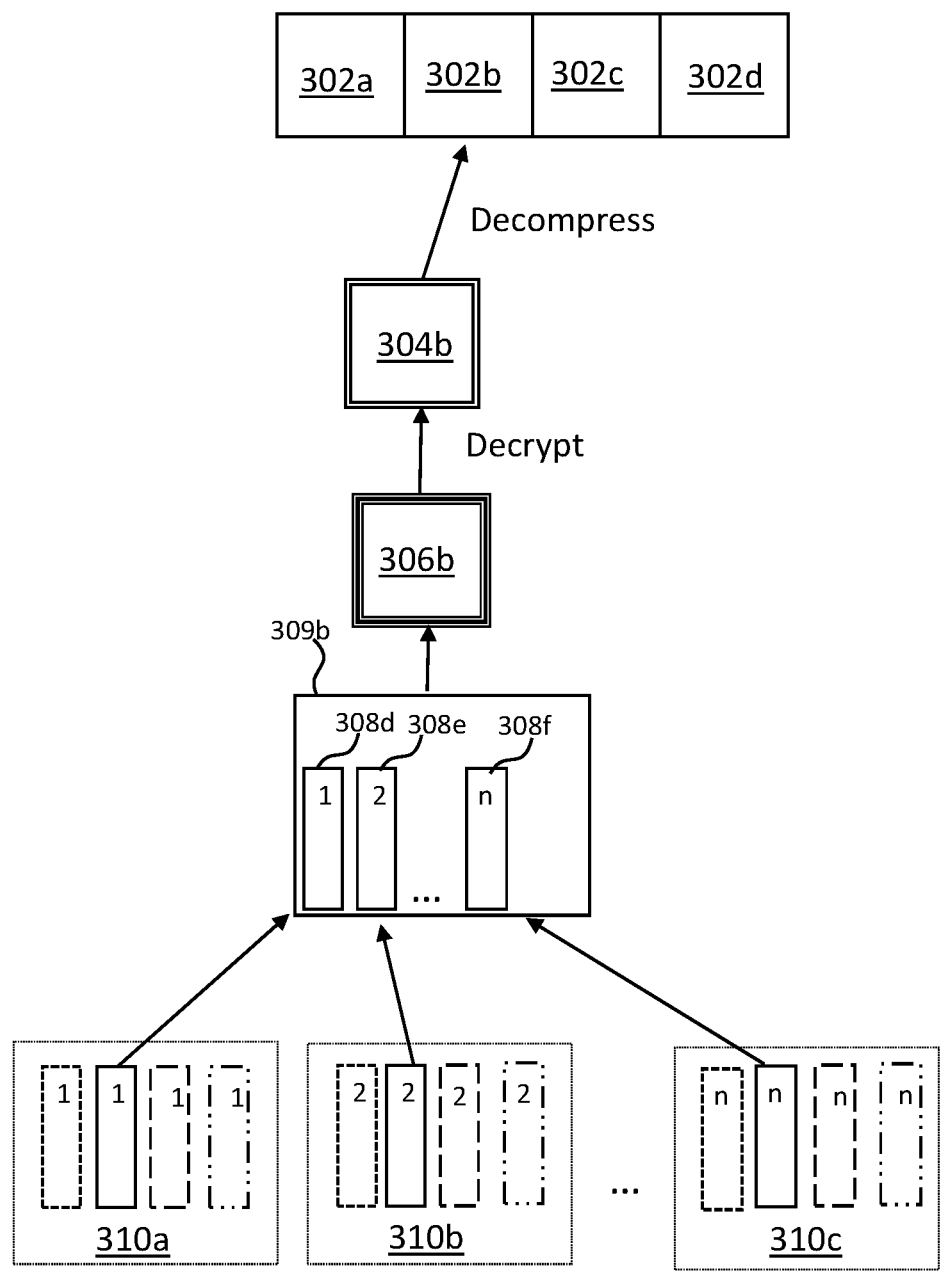
FIG. 4 is a schematic representation of an example method of retrieving a portion of a data object.

FIG. 4 shows a schematic representation of an example method in which the portion 302b of the data object 300 is retrieved. The parts 308d-f (at least) are retrieved from the combined blocks 310a-c respectively. In some examples, this can be done without accessing or retrieving the other parts stored in the combined blocks 310a-c. For example, this may utilise metadata which was created as part of the data storage operation to identify the storage location of the combined blocks 310a-c and the location of the parts 308d-f within those blocks. The parts 308d-f may be used (e.g. combined or concatenated) to form the erasure coded data portion 309b, from which encrypted compressed data portion 306b may be derived. Encrypted compressed data portion 306b is then decrypted to form compressed data portion 304b, and this is decompressed to form data portion 302b. It may be noted that, in this example, the portion 302b is retrieved from combined blocks 310a-c in isolation from any other portion of data object 300, although in other examples, multiple portions (or indeed portions which may be combined to regenerate the entire data object 300) may be retrieved. In addition, as erasure coding may generate information usable to reconstruct missing data, it may be the case that a subset of the parts 308 associated with a portion 302 may be retrieved, and the portion 302 may be successfully restored or regenerated from this subset using the additional information generated by erasure coding.

In some examples, the data object can be divided into any number of portions without changing the number of combined blocks. For example, referring to FIG. 3, if data object 300 were divided into five data portions, then the process described in relation to FIG. 3 may result in five respective erasure coded portions 309, and the combined blocks 310a-c may then each include an additional part (i.e., from the additional erasure coded data portion 309) without an increase in the number of combined blocks in some examples. In such examples, the granularity of the retrieval of data, which is based on the size of the data portions of the data object, can be varied without varying the number of combined blocks.

Figure 5:
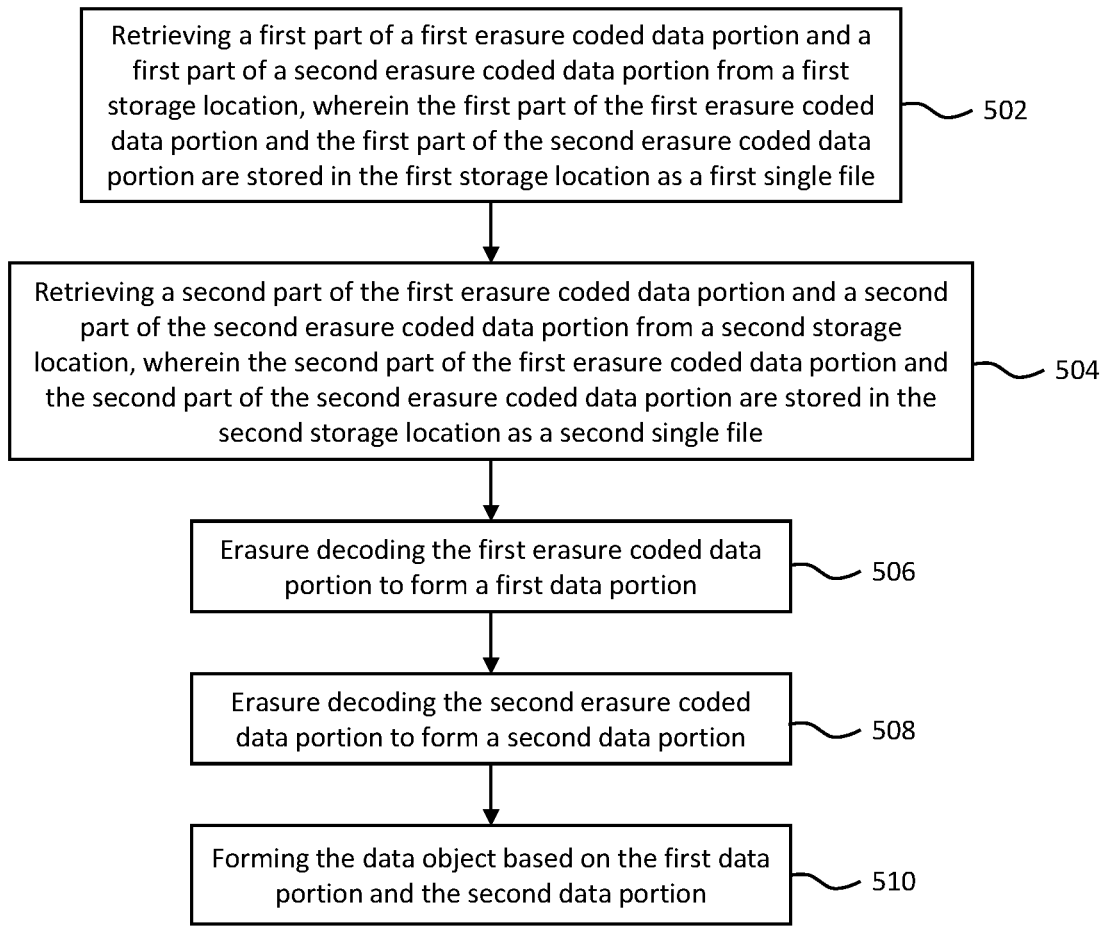
FIG. 5 is a flow chart of an example of a method of retrieving a data object.

FIG. 5 is a flow chart of an example of a method 500 of retrieving a data object, which may be performed by a computing device (e.g., at least one processor of a computing device executing instructions stored on a machine-readable storage medium). The data object may be generated by, received by, or obtained by a computing device carrying out the method 500. The data object may in some examples be a data object that is stored according to the method 100 or 200 described above. The method may for example be implemented using one or more processors of a computing device executing instructions stored on a machine-readable storage medium.

The method 500 comprises, in block 502, retrieving a first part of a first erasure coded data portion and a first part of a second erasure coded data portion from a first storage location, wherein the first part of the first erasure coded data portion and the first part of the second erasure coded data portion are stored in the first storage location as a first single file. The method 500 also comprises, in block 504, retrieving a second part of the first erasure coded data portion and a second part of the second erasure coded data portion from a second storage location, wherein the second part of the first erasure coded data portion and the second part of the second erasure coded data portion are stored in the second storage location as a second single file. In some examples, the first part of the first erasure coded data portion and the first part of the second erasure coded data portion can each be retrieved separately from the first single file, e.g. without accessing or retrieving the first part of the other erasure coded data portion in a single access or retrieval operation. Similarly, in some examples, the parts within the second single file can in some examples be retrieved separately, for example with reference to metadata or the like.

The method 500 also comprises, in block 506, erasure decoding the first erasure coded data portion to form a first data portion. Thus for example the first (decoded) data portion is formed from parts of an erasure coded data portion that are located in different storage locations. In some examples, the first and/or second storage locations are remote from the entity carrying out the method 500, and/or are remote from each other. Non-availability of a part of the first erasure coded data portion may in some examples not impact retrieval of the first data portion or the data object, as the other parts of the first erasure coded data portion could be used to reconstruct the unavailable part or reconstruct the data therein.

The method 500 also comprises in block 508, similarly, erasure decoding the second erasure coded data portion to form a second data portion. Next, block 510 comprises forming the data object based on the first data portion and the second data portion. For example, the data object may be formed from concatenating or combining the first and second data portions, or the data portions may first be decrypted and/or decompressed.

Figure 6:
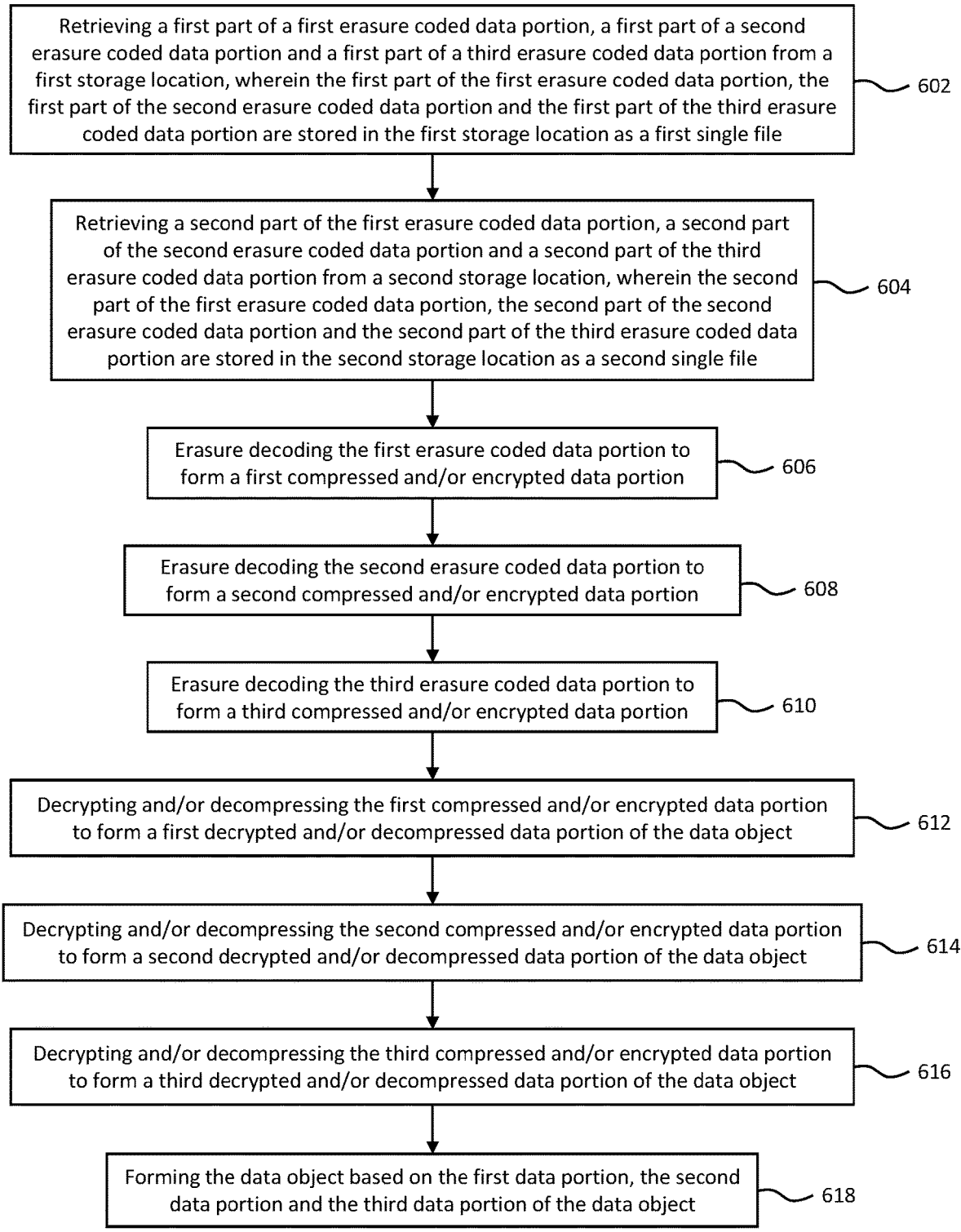
FIG. 6 is a flow chart of an example of a method of retrieving a data object.

FIG. 6 is a flow chart of an example of a method 600 of retrieving a data object. The method 600 comprises, in block 602, retrieving a first part of a first erasure coded data portion, a first part of a second erasure coded data portion and a first part of a third erasure coded data portion from a first storage location, wherein the first part of the first erasure coded data portion, the first part of the second erasure coded data portion and the first part of the third erasure coded data portion are stored in the first storage location as a first single file. The method 600 also comprises, in block 604, retrieving a second part of the first erasure coded data portion, a second part of the second erasure coded data portion and a second part of the third erasure coded data portion from a second storage location, wherein the second part of the first erasure coded data portion, the second part of the second erasure coded data portion and the second part of the third erasure coded data portion are stored in the second storage location as a second single file. In some examples, the first part of the first erasure coded data portion, the first part of the second erasure coded data portion and the first part of the third erasure coded data portion can each be retrieved separately from the first single file, e.g. without accessing or retrieving the first part of the other erasure coded data portions in a single access or retrieval operation. Similarly, in some examples, the parts within the second single file can in some examples be retrieved separately.

In some examples, each erasure coded data portion comprises one or more additional parts that are stored as combined blocks (with additional parts of other erasure coded data portion) in one or more additional storage locations.

Block 606 comprises erasure decoding the first erasure coded data portion to form a first compressed and/or encrypted data portion. Block 608 comprises erasure decoding the second erasure coded data portion to form a second compressed and/or encrypted portion. Block 610 comprises erasure decoding the third erasure coded data portion to form a third compressed and/or encrypted portion.

Block 612 of the method 600 comprises decrypting and/or decompressing the first compressed and/or encrypted data portion to form a first decrypted and/or decompressed data portion of the data object. Block 614 comprises decrypting and/or decompressing the second compressed and/or encrypted data portion to form a second decrypted and/or decompressed data portion of the data object. The method 600 may also comprise decrypting and/or decompressing the third compressed and/or encrypted data portion to form a third decrypted and/or decompressed data portion of the data object, in block 616.

The method 600 also comprises, in block 618, forming the data object based on the first data portion, the second data portion and the third data portion of the data object. For example, this may comprise concatenating or combining the first, second and third decrypted and/or decompressed data portions. In some examples, the data object may be formed based on one or more additional data portions. Each of the additional portions may be based on at least first and second parts of a respective erasure coded data portion, which parts are retrieved from respective storage locations from within respective combined blocks.

Thus for example the data object may be formed from data obtained from first, second and third different storage locations. The storage locations may be remote from each other and/or from a device carrying out the method 600. If one or two of the parts of an erasure coded data portion is unavailable (e.g. one of the storage locations is unavailable or inaccessible), the erasure coded data portion (or the data they represent) may still be reconstructable from the other parts due to the erasure code, which may be for example a Reed Solomon code.

In other examples, where there are any number of portions of the data object and corresponding erasure coded data portions, and each erasure coded data portion is separated into any number of parts, loss of up to a certain number of parts of an erasure coded data portion (depending on the erasure code used) may still allow the erasure coded data portion (or the data it represents) to be reconstructed or retrieved.

Figure 7:
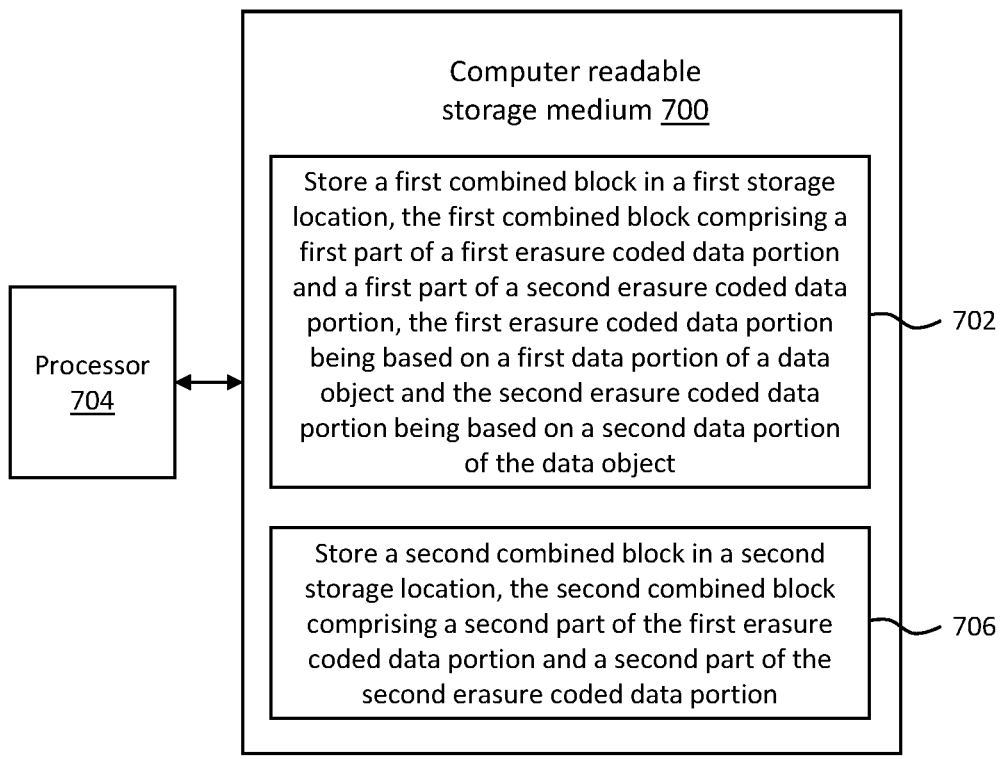
FIG. 7 is a schematic of an example of a non-transitory machine readable storage medium in association with a processor.

FIG. 7 is a schematic of an example of a non-transitory (and/or tangible) machine readable storage medium 700 comprising instructions 702 that, when executed by a processor 704, cause the processor 704 to store a first combined block in a first storage location, the first combined block comprising (at least) a first part of a first erasure coded data portion and a first part of a second erasure coded data portion, the first erasure coded data portion being based on a first data portion of a data object and the second erasure coded data portion being based on a second data portion of the data object.

The machine readable storage medium 700 also comprises instructions 706 that, when executed by a processor 704 (e.g., of a computing device), cause the processor 704 to store a second combined block in a second storage location, the second combined block comprising a second part of the first erasure coded data portion and a second part of the second erasure coded data portion.

Thus in some examples the data object can be stored in an efficient manner comprising first and second combined blocks, whereas each erasure coded data portion can be retrieved for example by retrieving the first and second parts of the erasure coded data portion without retrieving parts of other erasure coded data portions. Hence, retrieval of an erasure coded data portion, and hence of the associated data portion of the data block, can also be done efficiently.

Figure 8:
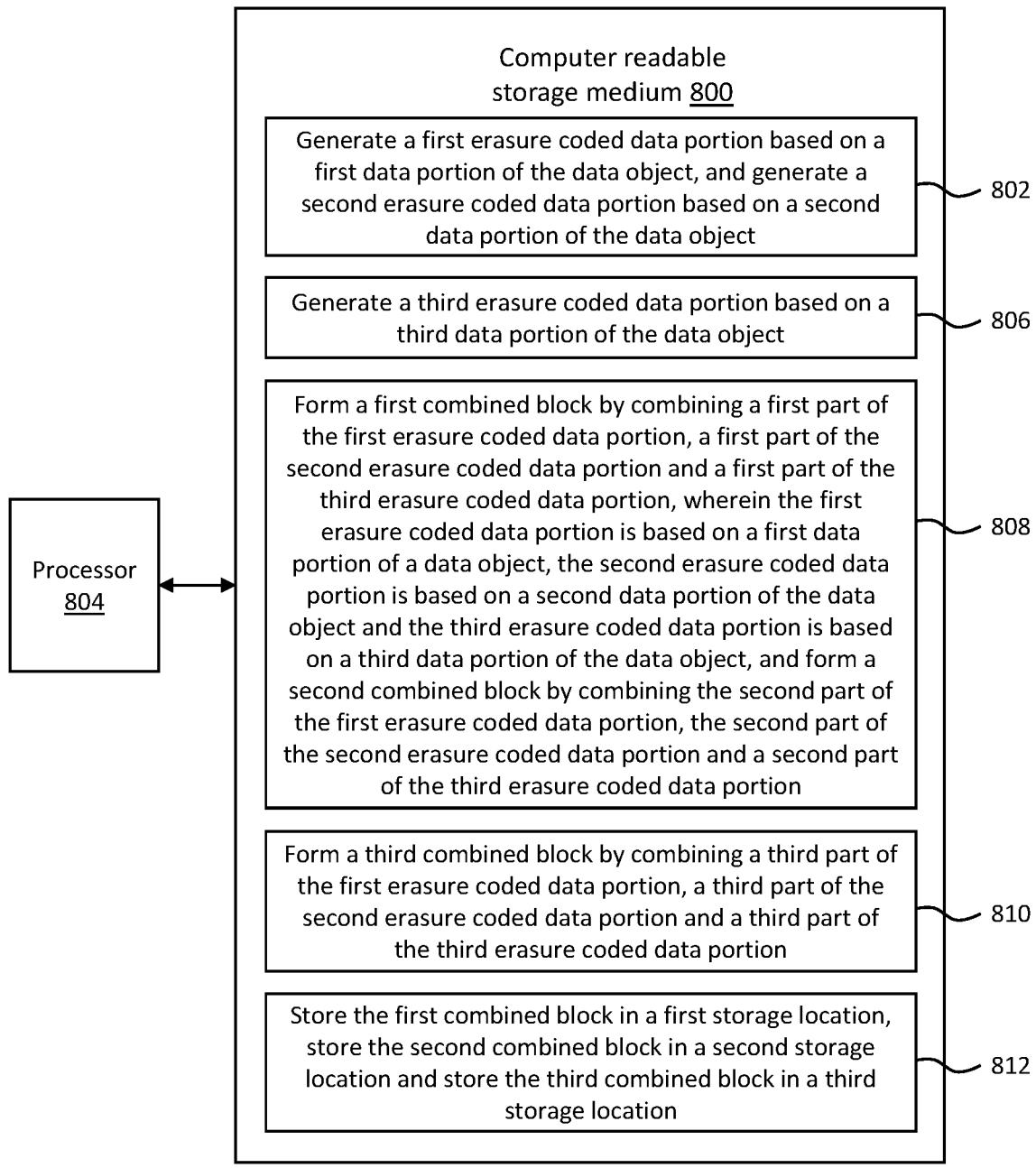
FIG. 8 is a schematic of another example of a non-transitory machine readable storage medium in association with a processor.

FIG. 8 is a schematic of an example of a non-transitory machine readable storage medium. The machine readable storage medium 800 comprises instructions 802 that, when executed by a processor 804, cause the processor 804 (e.g., of a computing device) to generate a first erasure coded data portion based on a first data portion of a data object, and generate a second erasure coded data portion based on a second data portion of the data object.

The machine readable storage medium 800 also comprises instructions 806 that, when executed by a processor 804, cause the processor 804 to generate a third erasure coded data portion based on a third data portion of the data object. In some examples, generating an erasure coded data portion may comprise compressing, encrypting and erasure coding (e.g. Reed-Solomon encoding) the associated data portion of the data object.

The machine readable storage medium 800 also comprises instructions 808 that, when executed by a processor 804, cause the processor 804 to form a first combined block by combining (at least) a first part of the first erasure coded data portion, a first part of the second erasure coded data portion and a first part of the third erasure coded data portion, wherein the first erasure coded data portion is based on a first data portion of a data object, the second erasure coded data portion is based on a second data portion of the data object and the third erasure coded data portion is based on a third data portion of the data object, and form a second combined block by combining (at least) the second part of the first erasure coded data portion, the second part of the second erasure coded data portion, and a second part of the third erasure coded data portion.

The machine readable storage medium 800 also comprises instructions 810 that, when executed by a processor 804, cause the processor 804 to form a third combined block by combining (at least) a third part of the first erasure coded data portion, a third part of the second erasure coded data portion and a third part of the third erasure coded data portion.

The machine readable storage medium 800 also comprises instructions 812 that, when executed by a processor 804, cause the processor 804 to store the first combined block in a first storage location, store the second combined block in a second storage location, and store the third combined block in a third storage location. In some examples, the first, second and third storage locations may be physically remote from each other (e.g., in different computing devices that are physically remote from one another, etc.).

In some examples, one or more additional erasure coded data portions may be generated based on respective portions of the data object, and a part of each of the additional erasure coded data portions may be included in each of the combined blocks, respectively. Additionally or alternatively, in some examples, each erasure coded data portion may include one or more further parts, and one or more further combined blocks may be formed. Each further combined block may be formed from respective parts from each of the erasure coded data portions and stored in respective remote storage locations.

In some examples, a remote storage or storage location comprises a storage that is accessible over a communications medium, such as one or more computer network(s), the Internet, or the like.

Examples in the present disclosure can be provided as methods, systems or machine readable instructions, such as any combination of software, hardware, firmware or the like. Such machine readable instructions may be included on a computer readable storage medium (including but is not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each block in the flow charts s, as well as combinations of the blocks in the flow charts diagrams can be realized by machine readable instructions.

The machine readable instructions may, for example, be executed by a general purpose computer, a special purpose computer, an embedded processor or processors of other programmable data processing devices to realize the functions described in the description and diagrams. In particular, a processor or processing apparatus may execute the machine readable instructions. Thus functional modules of the apparatus and devices may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

In examples described herein, functionalities described as being performed by "instructions" may be understood as functionalities that may be performed by those instructions when executed by a processing resource. In other examples, functionalities described in relation to instructions may be implemented by one or more engines, which may be any combination of hardware and programming to implement the functionalities of the engine(s).

As used herein, a "computing device" may be a server, storage device, storage array, desktop or laptop computer, switch, router, or any other processing device or equipment including a processing resource. In examples described herein, a processing resource may include, for example, one processor or multiple processors included in a single computing device or distributed across multiple computing devices. In examples described herein, a processing resource may fetch, decode, and execute instructions stored on a storage medium to perform the functionalities described in relation to the instructions stored on the storage medium. In other examples, the functionalities described in relation to any instructions described herein may be implemented in the form of electronic circuitry, in the form of executable instructions encoded on a machine-readable storage medium, or a combination thereof. The storage medium may be located either in the computing device executing the machine-readable instructions, or remote from but accessible to the computing device (e.g., via a computer network) for execution.

As used herein, a "machine-readable storage medium" may be any electronic, magnetic, optical, or other physical storage apparatus to contain or store information such as executable instructions, data, and the like. For example, any machine-readable storage medium described herein may be any of Random Access Memory (RAM), EEPROM, volatile memory, non-volatile memory, flash memory, a storage drive (e.g., a hard disk drive (HDD)), a solid state drive, any type of storage disc (e.g., a compact disc, a DVD, etc.), or the like, or a combination thereof. Further, any machine-readable storage medium described herein may be non-transitory. In examples described herein, a machine-readable storage medium or media may be part of an article (or article of manufacture). An article or article of manufacture may refer to any manufactured single component or multiple components. In some examples, instructions may be part of an installation package that, when installed, may be executed by a processing resource to implement functionalities described herein. All of the features disclosed in this specification (including any accompanying claims, abstract and drawings), and/or all of the elements of any method or process so disclosed, may be combined in any combination, except combinations where at least some of such features and/or elements are mutually exclusive.

Such machine readable instructions may also be stored in a computer readable storage that can guide the computer or other programmable data processing devices to operate in a specific mode.

Such machine readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method of storing a data object, the method comprising:
   generating a first erasure coded data portion based on a first data portion of the data object;
   generating a second erasure coded data portion based on a second data portion of the data object;
   forming a first combined block by combining a first part of the first erasure coded data portion and a first part of the second erasure coded data portion;
   forming a second combined block by combining a second part of the first erasure coded data portion and a second part of the second erasure coded data portion;
   storing the first combined block in a first storage location; and
   storing the second combined block in a second storage location different than the first storage location.

2. The method of claim 1, comprising generating a third erasure coded data portion based on a third data portion of the data object, and wherein:
   forming the first combined block comprises combining the first part of the first erasure coded data portion, the first part of the second erasure coded data portion, and a first part of the third erasure coded data portion; and
   forming the second combined block comprises combining the second part of the first erasure coded data portion, the second part of the second erasure coded data portion, and a second part of the third erasure coded data portion.

3. The method of claim 1, comprising:
   forming a third combined block, comprising combining a third part of the first erasure coded data portion and a third part of the second erasure coded data portion; and
   storing the third combined block in a third storage location.

4. The method of claim 1, wherein generating the first erasure coded data portion comprises Reed Solomon coding the first data portion of the data object, and generating the second erasure coded data portion comprises Reed Solomon coding the second data portion of the data object.

5. The method of claim 1, wherein:
   storing the first combined block in the first storage location comprises storing the first combined block in the first storage location in a single storage operation; and
   storing the second combined block in the second storage location storing the second combined block in the second storage location in a single storage operation.

6. The method of claim 1, wherein:
   storing the first combined block in the first storage location comprises storing the first combined block in the first storage location as a first single file; and
   storing the second combined block in the second storage location storing the second combined block in the second storage location as a second single file.

7. The method of claim 1, wherein:
   generating the first erasure coded data portion comprises compressing, encrypting and erasure coding the first data portion of the data object; and
   generating the second erasure coded data portion comprises compressing, encrypting and erasure coding the second data portion of the data object.

8. The method of claim 1, comprising, in response to a request for the first data portion of the data object, retrieving the first part of the first erasure coded data portion from the first storage location, and the second part of the first erasure coded data portion from the second storage location.

9. The method of claim 8, comprising:
decoding the first part of the first erasure coded data portion and the second part of the first erasure coded data portion to form a decoded data portion; and
decrypting and decompressing the decoded data portion to form the first data portion of the data object.

10. A method of retrieving at least a portion of a data object, the method comprising:
retrieving at least a first part of a first erasure coded data portion from a first storage location, wherein the first part of the first erasure coded data portion is part of a first combined block stored in the first storage location and comprising the first part of a second erasure coded data portion;
retrieving a second part of the first erasure coded data portion from a second storage location, wherein the second part of the first erasure coded data portion is part of a second combined block stored in the second storage location and comprising the second part of the second erasure coded data portion; and
deriving a first data portion from the first erasure coded data portion, including erasure decoding the first erasure coded data portion.

11. The method of claim 10, wherein the deriving further comprises:
decrypting and decompressing the first erasure coded data portion to form the first data portion of the data object.

12. The method of claim 10, comprising:
retrieving a first part of each of a plurality of erasure coded data portions from the first storage location, wherein the first parts of each of the plurality erasure coded data portions are stored in the first storage location as the first combined block;
retrieving a second part of each of the plurality of erasure coded data portions from the second storage location, wherein the second parts of the plurality of erasure coded data portions in the second storage location as the second combined block; and
erasure decoding the erasure coded data portions to form a first data portion of the data object from the first parts and a second data portion of the data object from the second parts.

13. The method of claim 12, further comprising forming the data object based on at least the first data portion and the second data portion.

14. A non-transitory machine readable storage medium comprising instructions that, when executed by a processor, cause the processor to:
store a first combined block in a first storage location of a first computing device, the first combined block comprising a first part of a first erasure coded data portion and a first part of a second erasure coded data portion, the first erasure coded data portion being based on a first data portion of a data object and the second erasure coded data portion being based on a second data portion of the data object; and
store a second combined block in a second storage location of a second computing device that is physically remote from the first computing device, the second combined block comprising a second part of the first erasure coded data portion and a second part of the second erasure coded data portion.

15. The non-transitory machine readable storage medium of claim 14, comprising instructions that, when executed by the processor, cause the processor to:
generate the first erasure coded data portion based on the first data portion of the data object; and
generate the second erasure coded data portion based on the second data portion of the data object.

16. The non-transitory machine readable storage medium of claim 14, comprising instructions that, when executed by the processor, cause the processor to:
store the first combined block in the first storage location in a single storage operation; and
store the second combined block in the second storage location in a single storage operation.

17. The non-transitory machine readable storage medium of claim 14, comprising instructions that, when executed by the processor, cause the processor to:
store the first combined block in the first storage location as a first single file; and
store the second combined block in the second storage location as a second single file.

18. The non-transitory machine readable storage medium of claim 14, comprising instructions that, when executed by the processor, cause the processor to:
generate a third erasure coded data portion based on a third data portion of the data object;
form the first combined block, comprising combining the first part of the first erasure coded data portion, the first part of the second erasure coded data portion, and a first part of the third erasure coded data portion, wherein the third erasure coded data portion is based on the third data portion of the data object; and
form the second combined block, comprising combining the second part of the first erasure coded data portion, the second part of the second erasure coded data portion, and a second part of the third erasure coded data portion.

19. The non-transitory machine readable storage medium of claim 14, comprising instructions that, when executed by the processor, cause the processor to:
store a third combined block in a third storage location, the third combined block comprising a third part of the first erasure coded data portion and a third part of the second erasure coded data portion.

20. The non-transitory machine readable storage medium of claim 14, comprising instructions that, when executed by the processor, cause the processor to:
generate the first erasure coded data portion by compressing, encrypting and erasure coding the first data portion of the data object; and
generate the second erasure coded data portion by compressing, encrypting and erasure coding the second data portion of the data object.

* * * * *